(12) United States Patent
Daicho et al.

(10) Patent No.: US 7,618,557 B2
(45) Date of Patent: Nov. 17, 2009

(54) WHITE LIGHT EMITTING PHOSPHOR AND LIGHT EMITTING MODULE USING THE SAME

(75) Inventors: Hisayoshi Daicho, Shizuoka (JP); Mutuo Masuda, Kyoto (JP); Hiroyuki Hayashi, Kyoto (JP)

(73) Assignee: Koito Manufacturing Co., Ltd., Tokyo (JP)

(*) Notice: Subject to any disclaimer, the term of this patent is extended or adjusted under 35 U.S.C. 154(b) by 315 days.

(21) Appl. No.: 11/773,085

(22) Filed: Jul. 3, 2007

(65) Prior Publication Data
US 2008/0123324 A1 May 29, 2008

(30) Foreign Application Priority Data
Jul. 3, 2006 (JP) .............................. 2006-183128

(51) Int. Cl.
*C09K 11/72* (2006.01)
*H01L 33/00* (2006.01)

(52) U.S. Cl. ................. 252/301.4 F; 313/503; 257/98

(58) Field of Classification Search ........... 252/301.4 F; 257/98; 313/503
See application file for complete search history.

(56) References Cited

U.S. PATENT DOCUMENTS 7,026,755 B2 * 4/2006 Setlur et al. .................. 313/501
7,536,834 B2 * 5/2009 Blanc et al. .................... 52/247

FOREIGN PATENT DOCUMENTS

JP 2927279 B2 5/1999
JP 2003-206482 A 7/2003

* cited by examiner

*Primary Examiner*—C. Melissa Koslow
(74) *Attorney, Agent, or Firm*—Sughrue Mion, PLLC (57) ABSTRACT

This invention provides a phosphor capable of emitting a white light by itself and a light emitting module using the phosphor. A white light emitting phosphor is represented by the following formula, and it is preferable that an excitation peak wavelength may be in a range of 350 to 420 nm: $Ba_{4-x-y-z}Mg_xSi_2O_8$: $Eu_y$, $Mn_z$ ($0.7 \leq x < 1$, $0 < y$ and $0 < z$). The white light emitting phosphor can constitute the light emitting module with a semiconductor light emitting device having an emission peak wavelength from 350 to 420 nm.

6 Claims, 6 Drawing Sheets

WHITE LIGHT EMITTING PHOSPHOR AND LIGHT EMITTING MODULE USING THE SAME

This application is based on and claims priority from Japanese Patent Application No. 2006-183128, filed on Jul. 3, 2006, the entire contents of which are hereby incorporated by reference.

BACKGROUND OF THE INVENTION

1. Technical Field

The present invention relates to a white light emitting phosphor and a light emitting module using the same, and more particularly to a phosphor for emitting a white light without using phosphors for emitting lights having other colors, and a light emitting module using the same.

2. Background Art

There has been developed an irradiation light source in which mercury is not used in respect of environmental issues and power saving considerations, and in which a light emitting diode (LED) or a semiconductor laser (LD) is combined as an excitation light source with a phosphor and a light emission at that time is set to be a light source, so that power consumption can be lower.

For example, Japanese Patent No. 2927279 discloses a light emitting diode for wholly emitting a white-color light based on an additive color mixture with a yellow-color light emitted from a Ce-activated rare earth aluminate phosphor that absorbs apart of a blue color light and emits a light. However, this combination type has a drawback that a rate of the blue light (a primary light) emitted from a semiconductor device to the yellow light (a secondary light) emitted from the phosphor is changed depending on a thickness of the phosphor disposed on the semiconductor device, and thus a stable emission spectrum cannot he obtained.

In recent years, in order to solve the above-described problem, a light emitting module in which an ultraviolet light or a visible light of a short-wavelength is set to be a primary light emitted from a semiconductor device and a phosphor having three components of green, blue and red is mixed, is introduced as a method of complementing a drawback caused by a white-color synthesis in a two-color addition. However, there are problems in the following aspects.

i) There are no phosphors for emitting red and green lights efficiently and stably in near ultraviolet rays.

ii) The green and red phosphors with an absorption in a broadband absorb a blue light so that the blue light is emitted unstably and a stable white light cannot be achieved.

iii) At least three types of phosphors of R, G and B are used. For this reason, mixing and dispersing steps are required so that cost is increased as a result.

In order to solve these problems, a composition that emits a white light using one type of phosphor has also been reported in Japanese Unexamined Patent Publication; JP-A-2003-206482. The emission spectra constitute the white light by a two-color mixture of a blue light and a complementary color for an orange color. However, there is a problem as to a luminance and a color rendering property due to a lack of a green spectrum having the highest spectral luminous efficacy.

SUMMARY OF THE INVENTION

Accordingly, an aspect of the present invention is to solve the above-described problems and to provide a phosphor capable of emitting a white light by itself, and a light emitting module using the phosphor.

Such is achieved by employing the following.

(1) A white light emitting phosphor is represented by the following formula;

$Ba_{4-x-y-z}Mg_xSi_2O_8: Eu_y, Mn_z$ ($0.7 \leq x < 1$, $0 < y$ and $0 < z$).

(2) In the white light emitting phosphor according to 1), a excitation peak wavelength is in a range of 350 to 420 nm.

(3) In the white light emitting phosphor according to 1) or 2), a white light obtained by an additive color mixture through light emitting peaks having blue, green and red color is emitted.

(4) In the white light emitting phosphor according to (3), a blue light having a wavelength peak from 420 to 450 nm, a green light having a wavelength peak from 490 to 530 nm and a red light having a wavelength peak from 600 to 640 nm are emitted.

(5) A light emitting module comprises a semiconductor light emitting device having an emission peak wavelength from 350 to 420 nm and the white light emitting phosphor according to 1).

DESCRIPTION OF EXEMPLARY EMBODIMENTS

The phosphor according to exemplary embodiment of the present invention can emit a white light without using a phosphor for emitting lights having other colors.

A white light emitting phosphor according to an exemplary embodiment of the present invention is represented by the following formula.

$Ba_{4-x-y-z}Mg_xSi_2O_8: Eu_y, Mn_z$ where $0.7 \leq x < 1$, $0 < y$ and $0 < z$ The white light emitting phosphor represented by the above-described formula has an excitation peak wavelength in a range of 350 to 420 nm. In particular, it is more preferable that the excitation peak wavelength may be 370 to 420 nm.

In the formula, it is also more preferable to replace a part of Ba with Sr or Zn.

The white light emitting phosphor according to an exemplary embodiment of the present invention emits a blue-light having a peak wavelength from 420 to 450 nm, a green light having a peak wavelength from 490 to 530 nm and a red light having a peak wavelength from 600 to 640 nm, and thus emits a white light as a whole.

In the formula, it is possible to regulate an emission intensity of a green color depending on a content of Mg and to regulate an emission intensity of a red color depending on a content of Mn. More specifically, when the content of Mg is reduced, the emission intensity of the green color becomes higher and that of a blue color becomes correspondingly lower. To the contrary, when the content of Mg is increased, the emission intensity of the green color becomes lower and that of the blue color becomes higher. Furthermore, the emission intensity of the green color is not changed depending on the content of Mn. When the content of Mn is reduced, however, the emission intensity of the blue color becomes higher and that of the red color becomes correspondingly lower. To the contrary, when the content of Mn is increased, the emission intensity of the blue color becomes lower and that of the red color becomes higher.

Moreover, the white light emitting phosphor according to an exemplary embodiment of the present invention may be a light emitting module in combination with an ultraviolet ray emitting semiconductor device.

In this case, it is sufficient that only the white light emitting phosphor according to an exemplary embodiment of the present invention is used as a phosphor in the light emitting module. In order to obtain a white color with a more desirable chromaticity, furthermore, other phosphors may also be used.

For example, it is possible to obtain a light emitting module with a more desirable whiteness by further using a phosphor for emitting green to orange lights with an excitation light in a wavelength range of 350 to 420 nm.

A semiconductor light emitting device used for a light emitting module with the white light emitting phosphor according to an exemplary embodiment of the present invention is not particularly restricted if the emission peak wavelength is in a range of 350 to 420 nm, and more preferably, 370 to 420 nm, A general InGaN/GaN based semiconductor light emitting device may be used for emitting an ultraviolet ray, for example, the semiconductor light emitting device as described in JP-A-2002-17100.

In the InGaN/GaN based semiconductor light emitting device, an emission peak wavelength is shifted toward long-wavelength sides when an amount of In is increased, and is shifted toward short-wavelength sides when the amount of in is decreased. In order to apply the InGaN/GaN based semiconductor light emitting device to the light emitting module, accordingly, the amount of In is properly regulated so that the light emitting peak wavelength can be in a range of 350 to 420 nm, and more preferably, 370 to 420 nm.

The light emitting module using the white light emitting phosphor according to an exemplary embodiment of the present invention comprises the semiconductor light emitting device and a phosphor including the white light emitting phosphor according to an exemplary embodiment of the present invention. More specifically, it is possible to employ a structure in which a layer of the phosphor is formed on the semiconductor light emitting device.

In that case, the phosphor layer formed on the semiconductor light emitting device may be arranged in a single layer or a plurality of layers by laminating a phosphor. In the case where plural types of phosphors are used, they may be arranged by a mixture in a single layer. In a configuration in which the phosphor layer is formed on the semiconductor light emitting device, it is possible to give examples of a configuration in which a phosphor is mixed with a coating member for covering a surface of the semiconductor light emitting device, a configuration in which a phosphor is mixed with a mold member or a configuration in which a phosphor is mixed with a covering member for covering a mold member, and furthermore, a configuration in which a plate capable of transmitting a light with which a phosphor is mixed is arranged in front of a projection side of a semiconductor light emitting device lamp.

Figure 1:
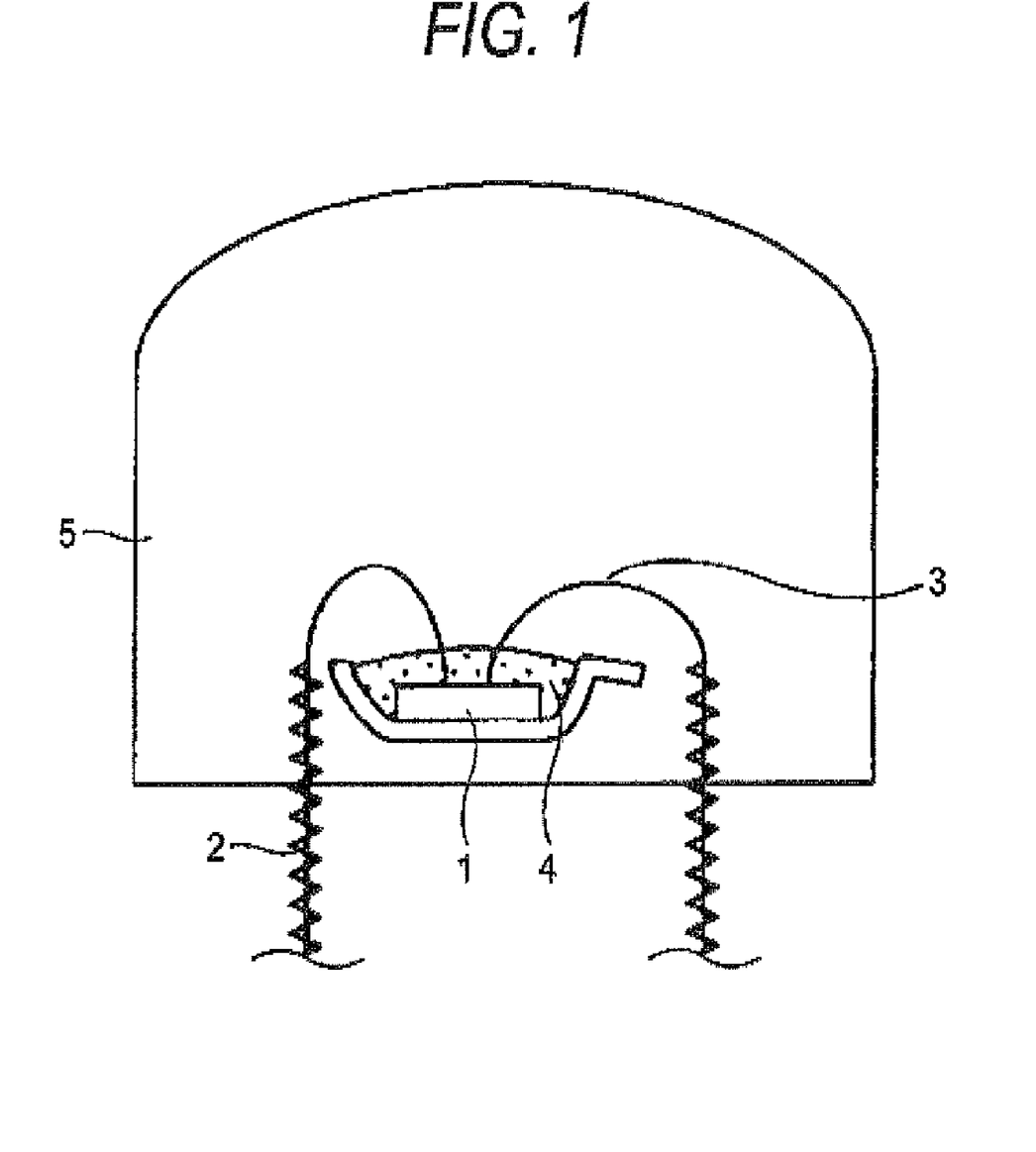
FIG. 1 is a view showing an example of a configuration of a light emitting module using a white light emitting phosphor according to an exemplary embodiment of the present invention.
Figure 2:
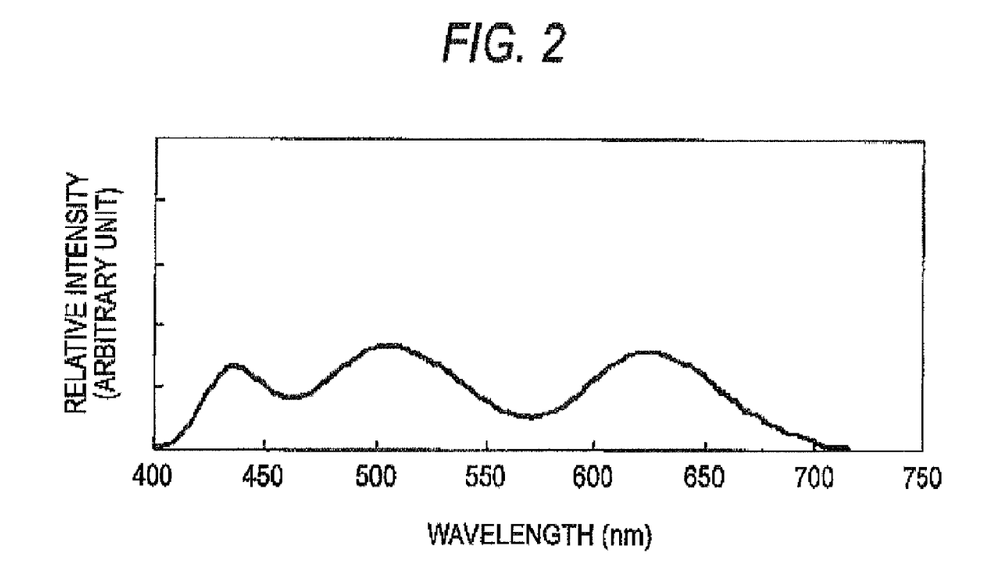
FIG. 2 is a graph showing an emission spectrum distribution of a white phosphor according to an exemplary embodiment.
Figure 3:
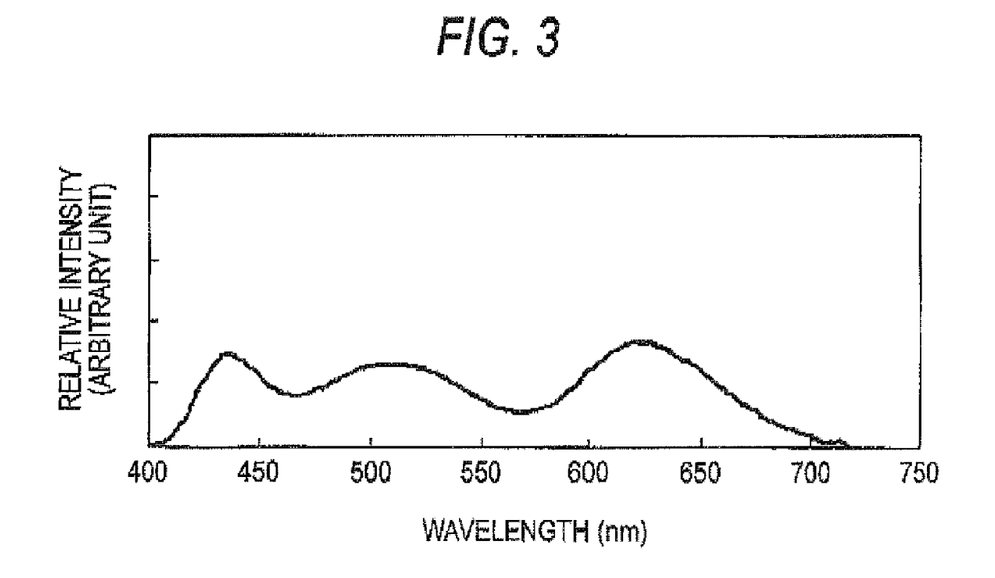
FIG. 3 is a graph showing an emission spectrum distribution of a white phosphor according to a comparative example 1.
Figure 4:
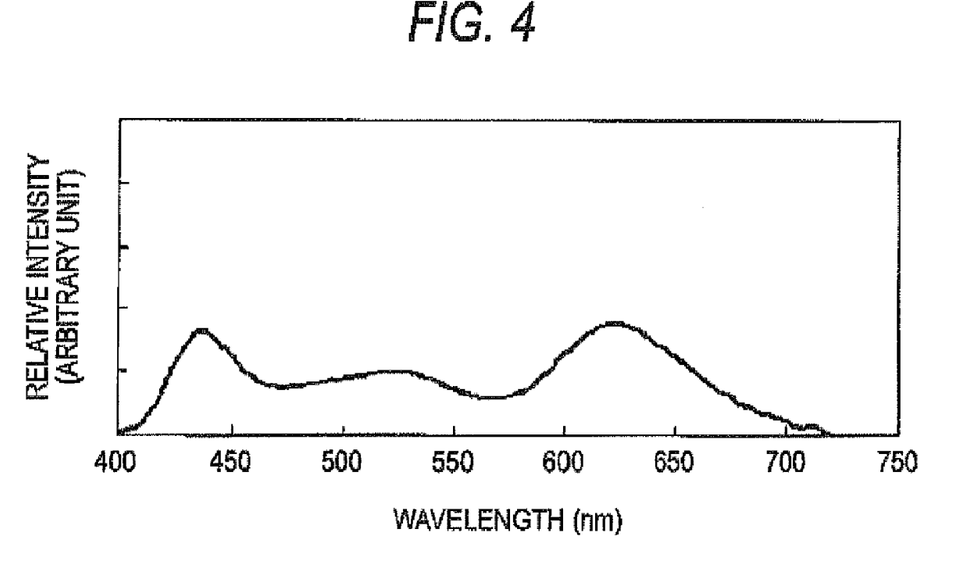
FIG. 4 is a graph showing an emission spectrum distribution of a white phosphor according to a comparative example 2.
Figure 5:
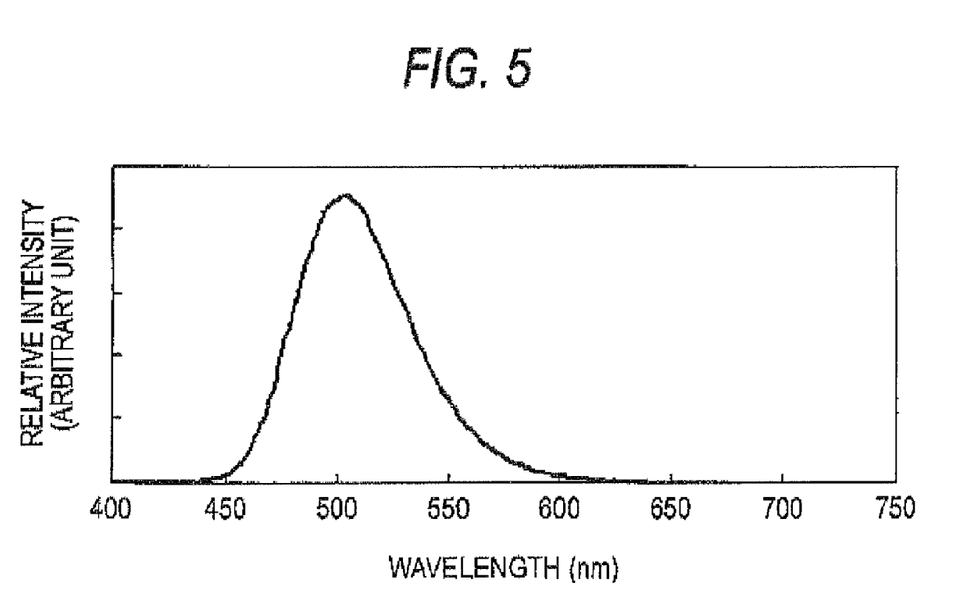
FIG. 5 is a graph showing an emission spectrum distribution of a white phosphor according to a comparative example 3.
Figure 6:
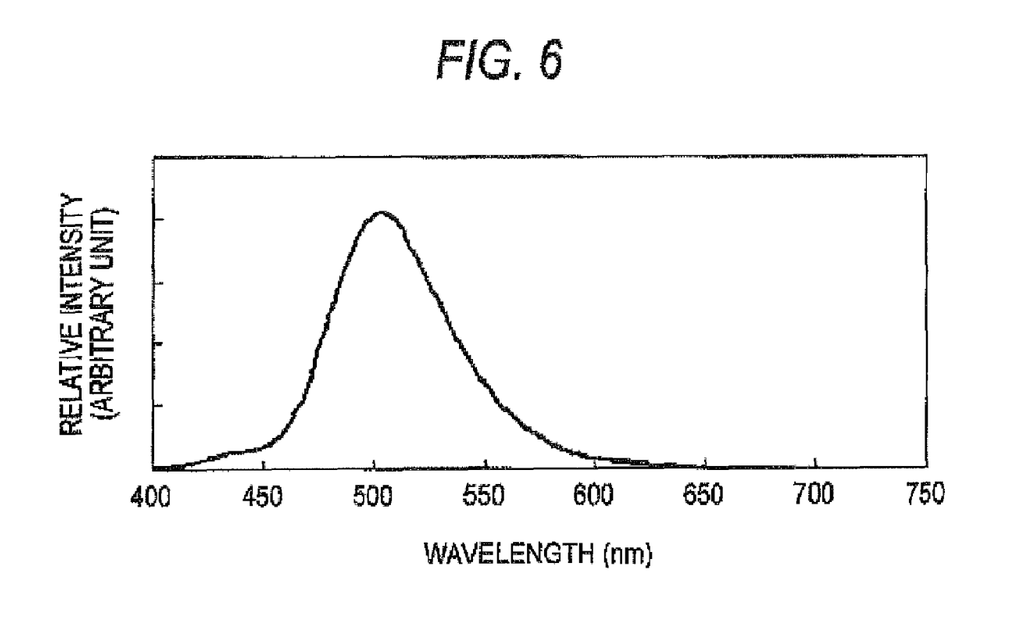
FIG. 6 is a graph showing an emission spectrum distribution of a white phosphor according to a comparative example 4.
Figure 7:
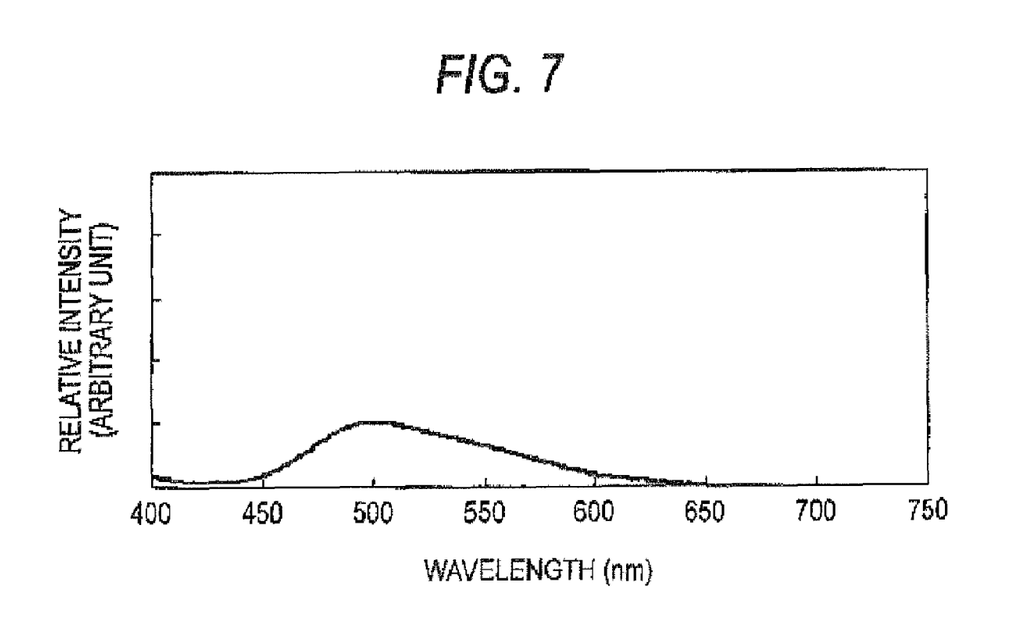
FIG. 7 is a graph showing an emission spectrum distribution of a white phosphor according to a comparative example 5.

FIG. 1 shows an example of a specific configuration of the light emitting module using the white light emitting phosphor according to the present invention. In the light emitting module shown in FIG. 1, a chip 1 is a short wavelength visible light LED chip including an InGaN active layer and having a center wavelength of approximately 395 nm. The short wavelength visible light LED chip 1 is fixed to a lead frame 2 through an adhesive layer. The short wavelength visible light LED chip 1 and the lead frame 2 are electrically connected to each other through a wire 3. The short wavelength visible light LED chip 1 is covered with a phosphor paste 4 obtained by kneading phosphor powder into a binder resin. Examples of the binder resin of the phosphor paste 4 includes a silicone resin, an epoxy resin, a urethane resin, a norbornene based resin, a fluororesin, metal alkoxide, polysilazane and an acrylic resin. Moreover, the light emitting module has a sealing member 5 for surrounding the phosphor paste 4. Examples of the sealing member 5 include but are not limited to transparent materials to a visible light such as a silicone resin, an epoxy resin, a urethane resine a norbornene based resin, a fluororesin, an acrylic resin and a low melting glass.

The configuration for the light emitting module is not restricted to the light emitting module structure but various configurations may be employed, for example, a light emitting surface of the short wavelength visible light LED chip 1 is coated with a phosphor layer.

EXAMPLE

Although exemplary embodiments of the invention will be more specifically described below, it is a matter of course that the range of the invention is not restricted thereto.

$BaCO_3$ (or $SrCO_3$, $CaCO_3$), $MgCO_3$, $SiO_2$, $Eu_2O_3$ and $MnCO_3$ are used as materials, and these powder materials are mixed in a stoichiometric ratio of respective compositions and are ground and mixed in an alumina mortar, and are then put in an alumina crucible and sintered at 1250° C. for three hours at a reducing atmosphere of a volume ratio of hydrogen/nitrogen=5/95. Consequently, phosphors shown in Table 1 are obtained.

TABLE 1

| | Composition |
|---|---|
| Example 1 | $Ba_{3.125}Mg_{0.8}Si_2O_8:Eu_{0.03},Mn_{0.045}$ |
| Comparative example 1 | $Ba_{2.925}Mg_{1.0}Si_2O_8:Eu_{0.03},Mn_{0.045}$ |
| Comparative example 2 | $Ba_{2.725}Mg_{1.2}Si_2O_8:Eu_{0.03},Mn_{0.045}$ |
| Comparative example 3 | $Ba_{1.9625}SiO_4:Eu_{0.015},Mn_{0.0225}$ |
| Comparative example 4 | $Ba_{3.526}Mg_{0.2}Si_2O_8:Eu_{0.03},Mn_{0.045}$ |
| Comparative example 5 | $Ba_{1.925}Mg_{2.0}Si_2O_8:Eu_{0.03},Mn_{0.045}$ |

(Fabrication of Light Emitting Module)

Figure 8:
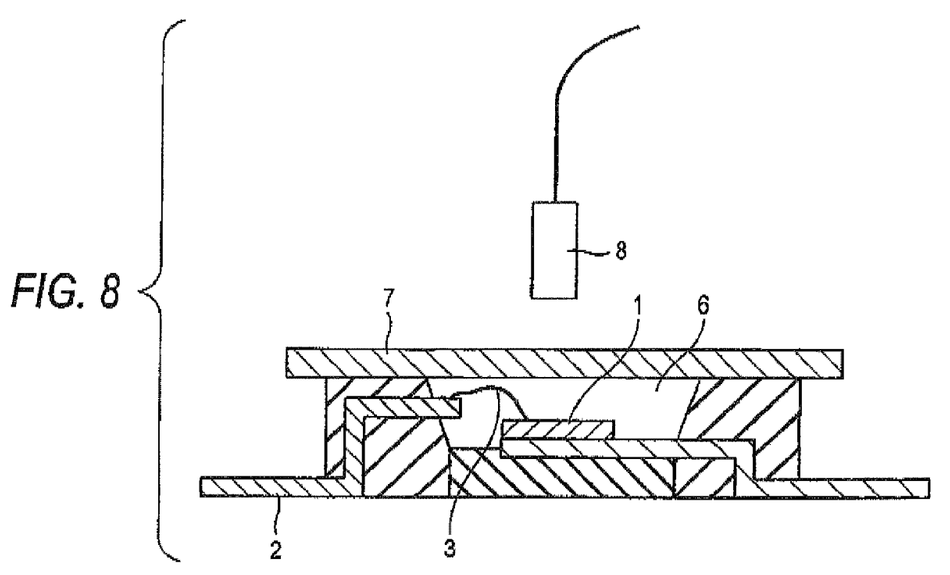
FIG. 8 is a schematic view showing a light emitting module according to an exemplary embodiment of the present invention.

A light emitting module shown in FIG. 8 is created to evaluate a light emitting characteristic. An InGaN/GaN based LED chip 1 having an emission wavelength of 395 nm and an external quantum efficiency of 18% is used as a semiconductor light emitting device. More specifically, lead frames 2 are disposed in a holder on a cup and the LED chip 1 is subjected to die bonding and a metal wire 3 is bonded to one of the lead frames 2 and is molded with a silicone resin (JSR-6301 manufactured by Dow Corning Toray Co., Ltd.) until a surface is flattened.

The phosphors according to example 1 and comparative examples 1 to 5 and a transparent binder 6 (JSR-6125 manufactured by Dow Corning Toray Co, Ltd.) are mixed at a ratio of 1:1 to fabricate a phosphor paste. A quartz plate having a thickness 1 mm is coated with the phosphor paste having a film thickness 100 µm so that a phosphor filter 7 is obtained. The phosphor filter 7 is cured at 150° C. for one hour and the phosphor is thus fixed onto the LED chip 1.

The light emitting module thus fabricated is conducted to the LED chip at a driving current 20 mA and a driving voltage 3.5V, and is caused to emit a light, and the emitting light is measured by a spectroscope 8 disposed above the light emitting module.

FIGS. 2 to 7 show emission spectra of the phosphors according to example 1 and comparative examples 1 to 5 and Table 2 shows an emission characteristic at excitation wavelength 380 nm.

sion becomes higher and the intensity of the emitted light having the blue color correspondingly becomes lower. To the contrary, when the content of Mg is increased, the intensity of the emitted light having the green color becomes lower and that of the emitted light having the blue color becomes higher.

Furthermore, it is possible to regulate an intensity ratio of the emitted lights having blue and red colors depending on an amount of Mn. The intensity of the emitted light having the green color is not changed depending on the amount of Mn. When a content of Mn is reduced, however, the emitted light having the blue color becomes higher and the emitted light having the red color correspondingly becomes lower. To the contrary, when the content of Mn is increased, the intensity of the emitted light having the blue color becomes lower and that of the emitted light having the red color becomes higher.

As described above, it is possible to regulate the luminescent color depending on the amounts of Mg and Mn. In the phosphor according to exemplary embodiments of the present invention, it is possible to regulate a preferable color for a white phosphor.

In the white light emitting phosphor according to exemplary embodiments of the present invention, a light emitting module may be constituted in a combination with an ultraviolet light emitting semiconductor device. The light emitting module may be expected to be applied to a lighting unit for a vehicle, for example.

While there has been described in connection with the exemplary embodiments of the present invention, it will be

TABLE 2

| | Peak intensity ratio | | | | Chromaticity | Color rendering property |
|---|---|---|---|---|---|---|
| | Blue | Green | Red | Integrated emission intensity ratio | (x/y) | Ra |
| Example 1 | 29 | 37 | 32 | 1.02 | 0.325/0.335 | 72 |
| Comparative example 1 | 32 | 28 | 37 | 0.98 | 0.344/0.316 | 66 |
| Comparative example 2 | 36 | 19 | 39 | 0.95 | 0.359/0.298 | 66 |
| Comparative example 3 | 0 | 100 | 0 | 1.00 | 0.148/0.587 | 2 |
| Comparative example 4 | 6 | 91 | 0 | 0.99 | 0.165/0.498 | 13 |
| Comparative example 5 | 1 | 21 | 0 | 0.35 | 0.236/0.467 | 35 |

Figure 9:
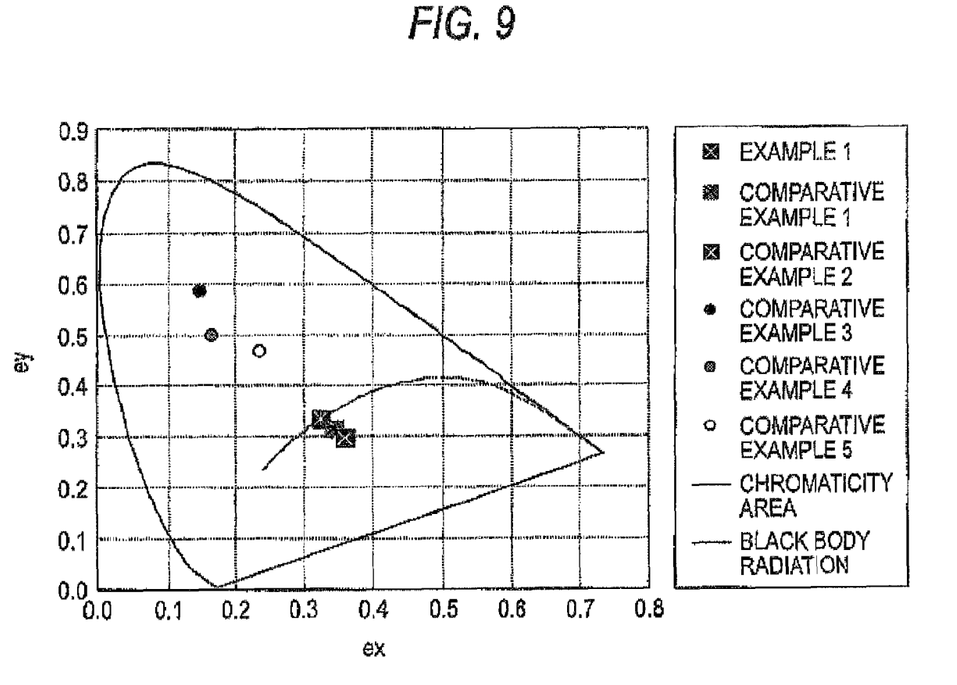
FIG. 9 is a chromaticity distribution graph in a case where a light is emitted by the light emitting module using the white phosphor according to each of example 1 and comparative examples 1 to 5.

FIG. 9 shows a chromaticity chart in the case where the phosphors obtained in example 1 and comparative examples 1 to 5 are used in the light emitting module.

As shown in the tables and the drawings, the above-described composition is employed so that a broad blue light emission having a peak wavelength of 438 nm, a broad green light emission having a peak wavelength of 503 nm and a broad red light emission having a peak wavelength of 625 nm are described in example 1. In example 1, as shown in FIG. 9, an additive color mixture of blue, green and red indicates a luminescent color in the vicinity of a blackbody radiation line, and thus a white light can be formed. Moreover, each of luminescent colors of blue, green and red indicates a broad emission spectrum. Therefore, the emission spectrum in example 1 has an excellent color rendering property and a color rendering coefficient is 72. A phosphor to be generally used as a light source for a vehicle has a color rendering coefficient of 60 or more. Therefore, the phosphor according to example 1 can be sufficiently used as the light source for a vehicle.

In the phosphor according to exemplary embodiments of the invention, each luminescent color can be regulated. Depending on an amount of Mg, it is possible to regulate an intensity ratio of the emitted lights having blue and green colors When a content of Mg is reduced, a green light emisobvious to those skilled in the art that various changes and modification nay be made therein without departing from the present invention. It is aimed, therefore, to cover in the appended claim all such changes and modifications as fall within the true spirit and scope of the present invention.

What is claimed is:

1. A white light emitting phosphor comprising a composition represented by providing:

0.7≦x<1;

0<y; and

0<z.

2. The white light emitting phosphor according to claim 1, wherein an excitation peak wavelength is in a range of 350 to 420 nm.

3. The white light emitting phosphor according to claim 1, wherein a white light obtained by an additive color mixture through light emitting peaks having blue, green and red colors is emitted.

4. The white light emitting phosphor according to claim 2, wherein a white light obtained by an additive color mixture through light emitting peaks having blue, green and red colors is emitted.

5. The white light emitting phosphor according to claim 3, wherein a blue light having a peak wavelength from 420 to 450 nm, a green light having a peak wavelength from 490 to 530 nm and a red light having a peak wavelength from 600 to 640 nm are emitted respectively.

6. A light emitting module comprising:

a semiconductor light emitting device having an emission peak wavelength from 350 to 420 nm; and a white light emitting phosphor comprising a composition represented by $Ba_{4-x-y-z}Mg_xSi_2O_8:Eu_y, Mn_z$ providing:

$0.7 \leq x < 1$;

$0 < y$; and $0 < z$.

* * * * *